United States Patent [19]

Parker et al.

[11] Patent Number: 5,389,470
[45] Date of Patent: Feb. 14, 1995

[54] TEMPERATURE RESPONSIVE BATTERY TESTER

[76] Inventors: Robert Parker, 212 Wildhorse Dr., Palm Desert, Calif. 92260; Jack Brass, 96 Hillmount Ave., Toronto, Ontario, Canada, M6B 1X6

[21] Appl. No.: 58,449

[22] Filed: May 7, 1993

[51] Int. Cl.6 .......................................... H07M 10/48
[52] U.S. Cl. ..................................... 429/90; 429/93; 324/435
[58] Field of Search .......................... 429/90, 92, 93; 324/435

[56] References Cited

U.S. PATENT DOCUMENTS

| | | | |
|---|---|---|---|
| 4,006,414 | 2/1977 | Parker | 429/90 |
| 4,571,533 | 2/1986 | Dey | 320/25 |
| 4,737,020 | 4/1988 | Parker | 429/93 X |
| 5,059,895 | 10/1991 | Cataldi et al. | 324/435 X |
| 5,128,616 | 7/1992 | Palmer | 324/435 |
| 5,216,371 | 6/1993 | Nagai | 429/90 X |

*Primary Examiner*—Stephen Kalafut
*Attorney, Agent, or Firm*—Renner, Otto, Boisselle & Sklar

[57] ABSTRACT

A temperature responsive tester for measuring the voltage of a voltage source includes a temperature responsive display and an electrical element thermally coupled with the temperature responsive display for heating the temperature responsive display when a voltage exceeding a predetermined threshold level is impressed across the electrical element. Other embodiments of a voltage tester are disclosed.

36 Claims, 2 Drawing Sheets

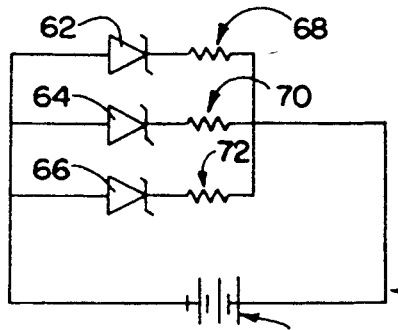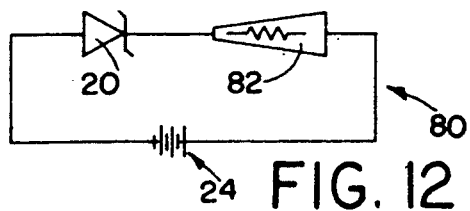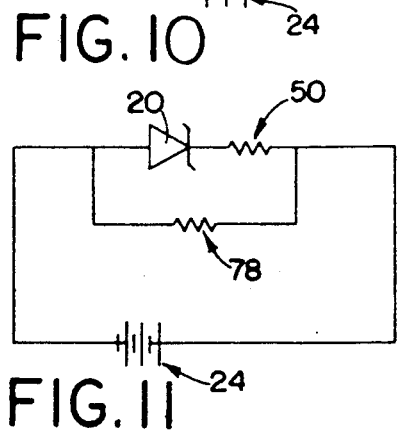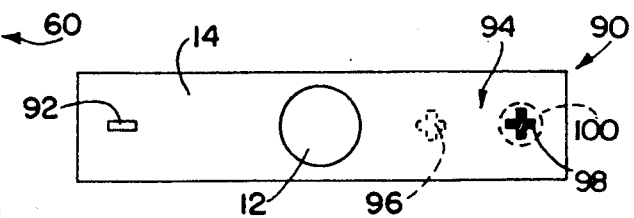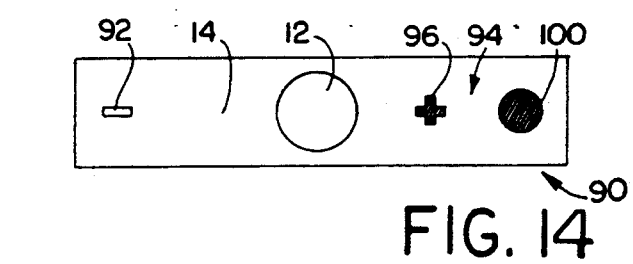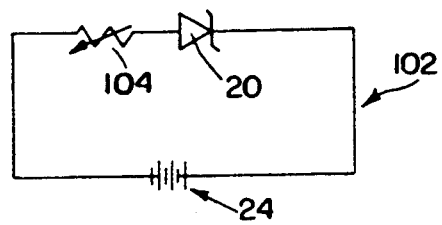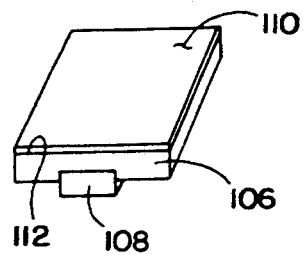

TEMPERATURE RESPONSIVE BATTERY TESTER

FIELD OF THE INVENTION

The invention relates generally to a voltage or current sensor, and, more particularly, to a device for accurately measuring the voltage of a battery.

BACKGROUND OF THE INVENTION

Devices employing thermochromic materials for testing the relative charge on a battery are well known. An example of one such device is that commonly found in a package of Duracell ® batteries. This type of device uses a tapered resistance conductor printed on one side of a thin polyester film with a thermochromic material printed in the other side of the film. When a voltage is applied across the tapered resistance conductor, a portion of the conductor roughly proportional to the charge of the battery is heated sufficiently to cause a corresponding portion of the thermochromic material to change from opaque to transparent, thus providing an indication of the relative voltage or charge of the battery. These devices work well for batteries, such as alkaline batteries, in which the relative voltage varies significantly from a fully charged condition to a depleted condition, for example, 50 percent or from 1.55 volts to 0.80 volts.

However, these tapered resistance devices do not work as well for some other types of batteries where the voltage delivered by a depleted battery is not a significant percent lower than the voltage delivered by a fully charged battery. For example, a lead-acid battery which is typically used in a car, truck or boat exhibits a very small change in voltage with respect to a large decrease in the charge of the battery. For instance, a lead-acid car battery may be at 13 volts when fully charged and decrease only to 12 volts when the battery is completely discharged. Rechargeable nickel-cadmium batteries, such as are used in portable computers, video cameras and power tools, also exhibit a relatively small change in voltage with respect to a large change in battery charge. In the case of nickel-cadmium batteries it is also desirable to be able to measure the voltage of the battery accurately in order to ascertain when the battery needs to be recharged. Nickel-cadmium batteries have a memory effect and thus should be almost completely discharged before recharging to promote a complete charge and longer battery life. However, these batteries should not be discharged completely or voltage reversal of the battery can result.

It would be desirable to provide a battery tester which is capable of accurately measuring small changes in the voltage delivered by a battery.

SUMMARY OF THE INVENTION

The battery tester of the present invention combines an electrical element, such as a zener diode, which exhibits a threshold conducting voltage with a temperature responsive display to permit accurate measurement of voltages and charges over a small range of battery voltages.

In accordance with one embodiment of the present invention, a device for measuring the voltage of a battery includes a temperature responsive material, a conductive heater for heating the temperature responsive material in response to an applied current, and a diode for applying a current from a battery to the conductive heater when the battery has a voltage exceeding a predetermined level.

In accordance with another aspect of the present invention, an apparatus for measuring the voltage of a voltage source includes a temperature responsive display, and an electrical element thermally coupled with the temperature responsive display for heating the temperature responsive display when a voltage impressed across the electrical element exceeds a predetermined threshold level.

In accordance with still another aspect of the invention, a device for testing a voltage source includes a temperature responsive display, and a diode thermally coupled with the temperature responsive display for hearing the temperature responsive display when the battery has a voltage exceeding a predetermined level.

In accordance with another aspect of the invention, a device for testing a voltage source includes a temperature responsive material having diodes thermally coupled with the temperature responsive material, each of the diodes heating a portion of the temperature responsive material when electrically coupled to a voltage source having voltage exceeding a predetermined level for each of the plurality of diodes.

In accordance with an additional aspect of the invention, a device for testing a voltage source includes a temperature responsive material, a diode in thermal contact with the temperature responsive material for heating the temperature responsive material when the voltage source has a voltage exceeding a predetermined level, and a conductive heater electrically in parallel with the diode for heating the temperature responsive material in response to an applied current.

In accordance with a still additional aspect of the invention, a circuit includes a thin dielectric film, a heat generating electrical component surface mounted to the dielectric film and, a temperature responsive material in thermal contact with the heat generating electrical component.

In accordance with a further aspect of the invention, a method for measuring the voltage across a device includes sensing the voltage of the device and generating heat to produce a visual indication when the detected voltage exceeds a predetermined threshold level.

In accordance with a further aspect of the invention, a device for testing a voltage source over differing ambient temperatures includes a first temperature responsive display, a diode thermally coupled to the first temperature responsive display and electrically coupled to plural conductive leads, the diode capable of heating the first temperature responsive display when a voltage exceeding a predetermined threshold level is impressed across the diode, and a second temperature responsive display which is responsive over ambient temperature ranges, the second temperature responsive display providing different visual indicia for different ambient temperatures to assist the user in determining at what point along the conductive leads to couple the leads to the voltage source.

In accordance with still a further aspect of the invention, a device for measuring the voltage of a voltage source includes a first temperature responsive display and, first and second diodes in electrical series, the first diode thermally coupled with the temperature responsive display for heating the temperature responsive display when a voltage exceeding a predetermined threshold level is impressed across the first and second diodes, the second diode for protecting the first diode from damage when the impressed voltage is of wrong polarity.

The foregoing and other features of the invention are hereinafter fully described and particularly pointed out in the claims, the following description and the annexed drawings setting forth in detail certain illustrative embodiments of the invention, these being indicative, however, of but a few of the various ways in which the principles of the invention may be employed.

BRIEF DESCRIPTION OF THE DRAWINGS

In the annexed drawings:

FIG. 10 is a schematic circuit diagram of an alternate embodiment of a battery tester in accordance with the present invention including multiple diodes in parallel;

FIG. 11 is a schematic circuit diagram of an alternate embodiment of a battery tester in accordance with the present invention including a resistance heating element which detects when the battery tester is connected to a battery;

FIG. 12 is a schematic circuit diagram of an alternate embodiment of the battery tester of the present invention including a tapered resistance heating element;

FIG. 13 is a top view of a battery tester in accordance with one embodiment of the present invention including temperature compensating abilities shown as the battery tester would appear at temperatures above a certain ambient temperature;

FIG. 14 is a top view of the battery tester of FIG. 11 illustrating the appearance of the battery tester at temperatures below a certain ambient temperature;

FIG. 15 is a schematic circuit diagram of a battery tester in accordance with one embodiment of the present invention including over-current protection; and FIG. 16 is a perspective view of a temperature responsive display in conjunction with an electrical package having current or voltage sensing capabilities.

DETAILED DESCRIPTION

Figure 1:
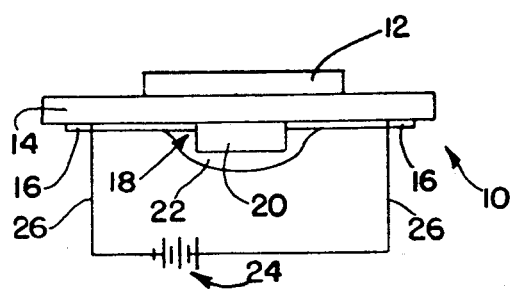
FIG. 1 is an elevation view of a battery tester in accordance with one embodiment of the present invention schematically connected to a battery source.

With reference to the several figures, and initially to FIG. 1, there is illustrated an elevation view of thermochromic battery tester 10 in accordance with one embodiment of the present invention. The battery tester 10 includes a temperature responsive display 12 disposed on one side of a thin film 14, such as a polyester film, with conductive strips or leads 16 disposed on the side of the film opposite the temperature responsive display. The temperature responsive display 12 and conductive strips 16 may be disposed on or applied to the film 14 through any of a variety of conventional methods including, for example, printing. The conductive strips 16 may also be constructed of multiple elements, for example, a section of wire or other conductive element attached to a printed conductive strip. The conductive strips 16 extend substantially the length of the film 14 with an interruption in an area 18 opposite the temperature responsive display 12. A zener diode 20 or other electrical component, such as another form of diode or a transistor, etc., which substantially conducts current only when the voltage across the device exceeds a threshold level is electrically connected to each of the conductive strips 16. The zener diode 20 is preferably packaged in a surface mount configuration and may be fixed to the film and held stationary such as through use of a potting material 22.

The temperature responsive display 12 disposed on the polyester film 14 preferably includes one or more thermochromic materials which exhibit a discernible visible change at a predetermined transition temperature. Preferably the thermochromic materials are of a certain opaque color, different from the color of the film 14 and different from each other, below their respective transition temperatures and transparent above their transition temperatures. When employing multiple thermochromic materials it is also desirable that the thermochromic materials have different transition temperatures.

The conductive strips 16 disposed on the film 14 provide electrical contact areas for pressure contact with the terminals of a battery to be tested, thus forming an electrical circuit including the battery electrically connected to the zener diode 20 by the conductive strips. The battery is illustrated schematically in FIG. 1 as a voltage source 24 and leads 26. Preferably, the battery tester 10 is configured to readily make contact with the terminals of a battery at designated areas on the conductive strips 16.

Figure 2:
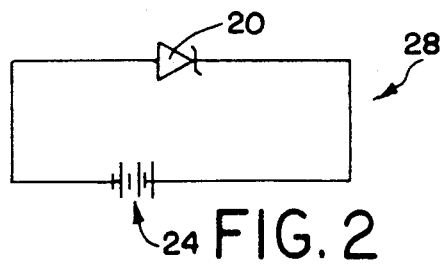
FIG. 2 is a schematic illustration of the circuit of the battery tester of FIG. 1.

The circuit of battery tester 10 of FIG. 1 is illustrated schematically in FIG. 2 as a zener diode 20 and voltage source 24. The zener diode 20 in the circuit 28 acts as a switch to bias the voltage produced by the voltage source 24 so that little or no current will flow through the circuit until a specific threshold conducting voltage of the zener diode is exceeded. At voltages supplied by the voltage source 24 exceeding the threshold conducting voltage of the zener diode 20, the diode will conduct electricity at a current which is a function of the internal resistance of the diode and the amplitude of the voltage produced by the voltage source exceeding the threshold voltage. In this manner the zener diode 20 biases the circuit 28 so that relatively small voltage changes produced by the voltage source 24 can be accurately measured. When the voltage source 24 is a car battery, for example, the circuit may be designed to measure only a one volt range of voltages between 13 and 12 volts, thus permitting the charge of the ear battery to be accurately measured.

When configured to operate as a tester for a car battery, as an example, a zener diode 20 typically will be employed with a threshold conducting voltage of approximately 12 volts. When the battery tester 10 is attached to the car battery, such as is schematically illustrated in FIG. 1 at 24, the zener diode 20 will bias the circuit so that at voltages below the threshold voltage of 12 volts there will be substantially no current through the circuit formed by the zener diode, the conductive strips 16, the battery 24 and leads 26. At voltages supplied to the zener diode 20 exceeding the threshold voltage of 12 volts, a current will flow through the circuit causing the zener diode to generate heat as a function of the voltage supplied from the battery exceeding the threshold conducting voltage and the internal resistance of the diode. The heat generated by the zener diode 20 is dissipated through the film 14 to heat the temperature responsive display 12 from the center of the display located directly above the zener diode and radially outwardly from the center of the display. Consequently, once the temperature responsive display 12 has been heated to its steady state condition, the center of the display will be the hottest with the temperatures at points radially more distant from the center being at progressively lower temperatures.

The thermochromic materials employed in the temperature responsive display 12 and the zener diode 20 are chosen so that at full charge for the battery 24, a relatively large area of the temperature responsive display will be heated to temperatures above the transition temperatures of the thermochromic materials. When the battery 24 is partially depleted, the battery will provide a voltage which exceeds the threshold voltage of the zener diode 20 to a lesser extent than when the battery is in a fully charged condition. Since the zener diode 20 generates heat as a function of the voltage supplied by the battery 24 exceeding the threshold voltage of the diode and the internal resistance of the diode, the diode will generate less heat when the battery is in a partially depleted condition than when it is in its fully charged condition. Therefore, when the battery is in a partially depleted condition a lesser area of the temperature responsive display 12 will be elevated above the transition temperature of the thermochromic materials employed therein.

When the battery is sufficiently depleted that it can supply a voltage only below the threshold voltage of the zener diode 20, the diode acts as a switch preventing any substantial amount of current flow through the circuit. Consequently, relatively little, if any, heat is generated by the zener diode 20 and the temperature of preferably no areas of the temperature responsive display 12 is elevated to such an extent as to cause a visual response in the temperature responsive display.

By choosing a zener diode 20 with a correct threshold conducting voltage and thermochromic materials with appropriate transition temperatures, the battery tester 10 can be made to visually indicate different conditions of the battery, such as fully charged, partially charged, in need of recharge and significantly depleted. The design of the temperature response display 12, as well as the transition temperatures of the thermochromic materials employed therein, can also enhance the information available regarding the battery charge.

Figure 3:
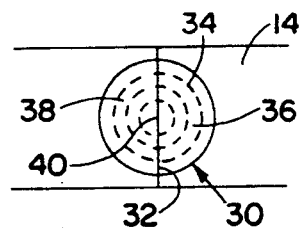
FIG. 3 is a top view of a battery tester illustrating the temperature responsive display of the battery tester.

FIG. 3 is an illustration of a temperature responsive display 30 disposed on the film 14 in a circular area. The film is preferably of two distinct colors. One color, for example, orange, being to the right of a dividing line 32 and another color, for example, green, to the left of the dividing line 32 which is easily distinguishable from the color to the right of the dividing line. The film 14 is preferably provided with a series of concentric circular gradations 34 corresponding to certain voltage readings for the battery to be tested. The temperature responsive display 30 includes two half-circular areas of different thermochromic materials 36, 38 having differing transition temperatures. The half-circular area 36 of the thermochromic material disposed to the right of the dividing line 32 may have, for example, a transition temperature of 45° C. below which the material is opaque, say, black, and above which the material is transparent, while the half circle of thermochromic material 38 disposed to the left of the dividing line 32 may be opaque, for example also black, below its transition temperature of 60° C. and transparent above that transition temperature.

Consider as an example the battery tester 10 described above relative to FIG. 1 provided with the temperature responsive display 30 of FIG. 3 and having a zener diode 20 with a threshold conducting voltage of 12 volts. If the battery tester 10 is applied across the terminals of a car battery 24, at voltages supplied by the car battery below 12 volts, no visual change to the temperature responsive display will be apparent, i.e., the display will appear black. As successively increasing battery voltages above the threshold voltage of the zener diode 20, areas of the thermochromic material 36 will be heated above their transition temperatures of 45° C. starting at the center 40 of the display 30 and moving radially outwardly for increasing battery voltages. These areas will change from black to orange as the thermochromic material 36 transitions from black to transparent to reveal the orange portions of the film 14 and any gradations 34 in this portion of the film. At higher supplied voltages from the battery 24, the thermochromic material 38 to the left of the dividing line 32 from the center of the display 40 and extending radially outwardly will begin to exceed its transition temperature of 60° C. and change to a transparent state. As areas of the thermochromic material 38 change from black opaque state to a transparent state, the green colored portion of the film 14 and the printed gradations 34 below the thermochromic material will be revealed. Consequently, for a battery having a full charge, substantially the complete portions of both half-circles of thermochromic material 36, 38 will be heated above their transition temperatures to reveal the colored film and substantially all of the gradation lines 34 beneath the thermochromic materials. For a progressively more depleted battery fewer gradation lines 34 of the temperature responsive display will be visible as less of each half circle of thermochromic material 36, 38 is heated above its respective transition temperature. If the battery is able to produce a voltage only slightly above the threshold voltage of 12 volts for the zener diode 20, only a small region of the half circular area of thermochromic material 36 will be in a transparent state allowing only a small portion of the film 14 and possibly a gradation line or two 34 to be visible.

Figure 4:
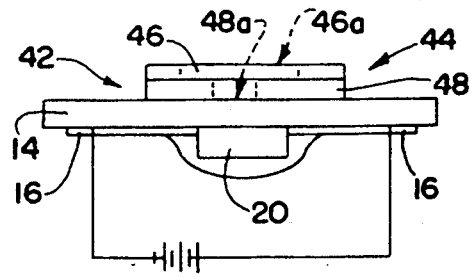
FIG. 4 is an elevation view of a battery tester similar to that of FIG. 1 employing a different temperature responsive display.
Figure 5:
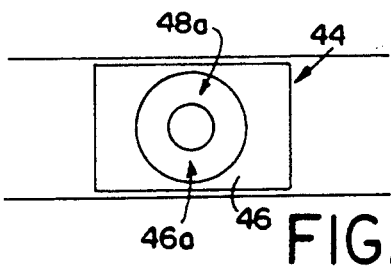
FIG. 5 is a top view of the temperature responsive display of the battery tester of FIG. 4.

A battery tester 42 with an alternate embodiment of a temperature responsive display 44 is illustrated in FIGS. 4 and 5. In this embodiment, the battery tester 42, exclusive of the temperature responsive display, is configured in the same manner as described above relative to FIG. 1 with a polyester film 14, conductive strips 16 and a zener diode 20. The film 14 may be one color, for example, green, or may have multiple concentric areas of different colors further to enhance resolution of the display 44. In some instances, it may be desirable to print generally concentric circular gradations on the film 14 at the center of the display 44 to facilitate a visual reading of the voltage level supplied by the battery. The temperature responsive display 44 includes two thermochromic materials 46 and 48 one atop the other on the surface of the film 14 opposite the zener diode 20. The thermochromic materials 46, 48 are preferably configured in a rectangular shape with the thermochromic material 48 being immediately adjacent the film 14 and the thermochromic material 46 lying directly atop the thermochromic material 48. The thermochromic layers 46, 48 are chosen with dissimilar transition temperatures and preferably different colors in their opaque states. For example, the thermochromic layer 48 directly adjacent the film 14 may have a transition temperature of 60° C. and an opaque color of red, while the thermochromic layer 46 remote from the film may have a transition temperature of 45° C. and a black opaque color below the transition temperature. In use, the temperature responsive display 44 will appear black if the voltage supplied by the battery 24 is below the threshold voltage of zener diode 20, but will exhibit a bullseye pattern if the voltage supplied is significantly above the threshold voltage of the zener diode, as is described just below.

In the embodiment of FIGS. 4 and 5, for voltages supplied to the zener diode 20 by the battery 24 substantially above the threshold conducting voltage of the diode, the diode will generate sufficient heat, once conducted through the film 14, to elevate the temperature of the temperature response display 44 above the transition temperatures of the thermochromic materials 46, 48. In such an instance, a large relatively circular area 46a of the thermochromic material 46 will change to a transparent state permitting viewing of the thermochromic material 48 beneath it. (In FIG. 4 the dashed lines indicate boundaries across which the thermochromic material transitions from opaque to transparent.) The thermochromic material 48, having a higher transition temperature than the thermochromic material 46, will also change to a transparent state but over a smaller generally circular area 48a centered in the display 44, thus allowing viewing of the green film 14 therebelow. Consequently, for a fully charged battery the temperature responsive display 44 will appear as a bullseye pattern having a relatively large generally circular area of the green film 14 visible. At slightly depleted battery charges, the battery will supply the zener diode 20 with a somewhat lesser voltage above the threshold voltage, and thus the diode will generate somewhat less heat than in the fully charged condition. This will in turn cause the thermochromic materials 46 and 48 to reach their transition temperatures over somewhat smaller circular areas centered on the display 44. Thus at a slightly reduced charge for the battery, the display 44 may indicate a bullseye pattern with a very small green area of the film 14 visible. At even lesser charges for the battery, the zener diode 20 may not generate sufficient heat to elevate the thermochromic material 48 above its transition temperature yet a small portion of the thermochromic material 46 may still be at a sufficiently high temperature to transition to its transparent state. In this case, the temperature responsive display 44 will appear as a black rectangular area with a circular area centered in the display 44 through which the thermochromic material 48 in its red opaque state is visible. For a fully depleted battery, the voltage generated by the battery will fall below the threshold voltage of the zener diode 20, and the diode will effectively turn off current flow through the circuit thus leaving the temperature responsive display 44 substantially unheated and in its completely black state.

Figure 6:
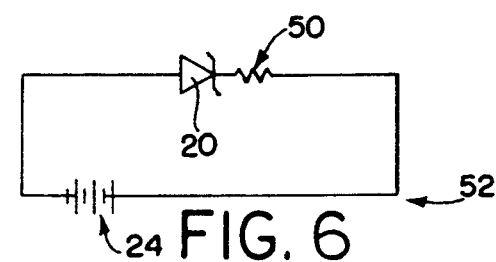
FIG. 6 is a schematic circuit diagram of a battery tester in accordance with an alternate embodiment of the present invention including a current limiting resistor.

In order to protect the zener diode 20 from suffering damage due to an excessive current being applied across the diode, a current limiting resistor 50 may be placed in series with the zener diode 20, as is shown in the circuit 52 illustrated in FIG. 6. The current flowing through the circuit 52 is a function of the voltage $V_{batt}$ impressed across the zener diode 20 exceeding the threshold conducting voltage $V_{thresh}$ of the diode, the internal resistance of the diode $R_z$ and the resistance of the current limiting resistor $R_{CLR}$. As a result, the amplitude of current I allowed to flow through the circuit 52 can be controlled by the resistance value of current limiting resistor 50 employed in the circuit. For example, if the zener diode has a threshold voltage $V_{thresh}$ of 12 volts and an internal resistance $R_z$ of 2 ohms and the battery $V_{batt}$ generates 14 volts, employing a 12 ohm current limiting resistor 50 in the circuit 52 would result in a current through the circuit as follows:

$$I = \frac{V_{batt} - V_{thresh}}{R_{CLR} + R_Z} = \frac{14 - 12}{10 + 2} = 167 \text{ milliamps}$$

Such a current is sufficiently low to not damage the electrical components of the battery tester.

However, as the heat generated by the zener diode 20, which causes the temperature responsive display to assume a certain visual readout, is a function of the current across the zener diode as well as the internal resistance of the diode, the reduction of current through the device as a result of addition of the current limiting resistor 50 must be accounted for in the selection of proper thermochromic materials in the temperature responsive display. Further, the current limiting resistor 50 also generates heat as a function of the current through the resistor and its resistance. Consequently, the current limiting resistor 50 must have a sufficiently large surface area to dissipate enough of the generated heat to prevent damage to the device.

Another advantage to using a current limiting resistor in a battery tester circuit is that it can be implemented as a thin film resistor and used as a trimming resistor to compensate for variations in the actual threshold conducting voltage of the zener diode from the design threshold conducting voltage. A typical tolerance on the threshold conducting voltage for a silicon zener diode is plus or minus 5% or higher. Consequently, for a battery tester designed to measure relatively higher voltages, for example 12 to 60 volts, the variation in the threshold conducting voltage for the zener diode from the design voltage may result in an unacceptable shift in the operating parameters of the battery tester. In production, the threshold voltage of the zener diode in an assembled battery tester can be measured using an ammeter. If the zener diode conducts electricity at too low of a voltage, a small hole can be punched in the current limiting resistor to raise the resistance of the current limiting resistor thus reducing current flow through the tester and effectively shifting the threshold conducting voltage of the zener diode higher.

A further advantage to employing a current limiting resistor is to provide protection to the diode and other electrical components of the battery tester if the battery tester is connected to a battery in the wrong polarity. A zener diode has a very low resistance when employed in a circuit counter to its intended direction. Further, when employed in the opposite direction, the zener diode does not exhibit a threshold voltage and thus does not bias the circuit. Hence, without employing a current limiting resistor, a significantly higher current is drawn through the circuit than when the battery tester is connected in the correct direction. For example, in the wrong direction the zener diode may have a resistance of 1 ohm and since the 14 volt supply of the battery then is not effectively biased by the zener diode, the current through the circuit is:

$$I = \frac{V_{batt}}{R_Z} = \frac{14}{1} = 14 \text{ amps}$$

Figure 8:
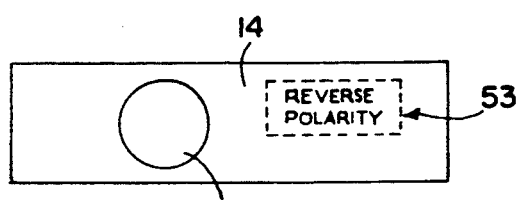
FIGS. 7 and 8 illustrate visual states of an exemplary temperature responsive display used to provide a visual indication as to whether the battery tester is connected in the correct polarity.
Figure 7:
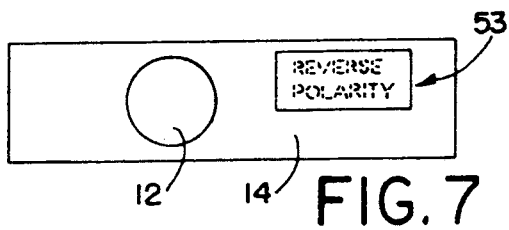

This excessive current could burn out the printed conductors or zener diode. By employing a current limiting resistor in the circuit of the battery tester not only is a degree of protection provided to the electrical components of the battery tester, but the current limiting resistor can be used to provide a visual indication that the battery tester is connected in reverse polarity. Since more current is drawn through the circuit when the battery tester is connected to a battery at the wrong polarity the current limiting resistor 50 will generate a significant amount of heat which can be used to operate a temperature responsive display 53 to provide a visual indication that the connection polarity is reversed. In such an instance, the temperature responsive display 53 may include a thermochromic material disposed upon an area of the film having been printed with a pattern such as the words "reverse polarity" or another graphic display covering a similar message. The temperature responsive display 53 would then appear opaque when the battery tester is not connected to a battery or is connected in the correct polarity as illustrated in FIG. 7 (the dashed lines indicating a pattern which is obstructed from view by the opaque temperature responsive display). However, when connected in the wrong polarity, the current limiting resistor 50 will heat the temperature responsive display 53 to a sufficient temperature to cause the thermochromic material of the display to transition to a transparent state to indicate the words "reverse polarity" as illustrated in FIG. 8.

Figure 9:
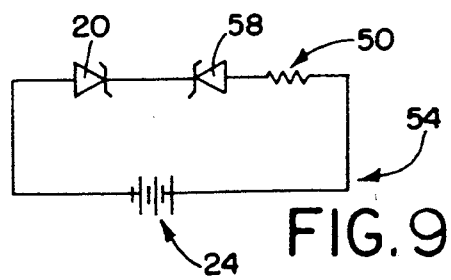
FIG. 9 is a schematic circuit diagram of an alternate embodiment of the battery tester of the present invention including multiple zener diodes in opposite directions in the circuit.

It is also possible to provide additional protection to the battery tester against damage which could be caused by connecting the battery tester to a battery in the wrong polarity by including in series with the diode 20 and the current limiting resistor 50, a second zener diode 58 in opposite direction to the zener diode 20 as is schematically illustrated in the circuit 54 of FIG. 9. When a battery tester configured as is illustrated in the circuit 54 is connected to a battery in the correct polarity, the battery tester functions in the same manner as described above relative to the circuit 52 illustrated in FIG. 6, with the second zener diode 58 providing little resistance to current flow and no voltage biasing of its own. However, if a battery tester configured as is illustrated in circuit 54 is connected to a battery with the polarity reversed, the second zener diode 58 limits the current flow through the circuit as a function of the voltage of the battery 24 exceeding the threshold conducting voltage of the second zener diode 58 and the internal resistance of the second zener diode and the resistance of the current limiting resistor 50. When such a battery tester is connected to a battery in reverse polarity the second zener diode 58 acts as the first zener diode did relative to circuit 52 in FIG. 6 when connected in the correct polarity. Similarly, the first zener diode 20, being in reverse polarity, will exhibit no voltage biasing and little internal resistance as did the second zener diode 58 when the battery tester was connected in the correct polarity. Consequently, the zener diode 58 will generate sufficient heat when placed in thermal contact with a second temperature responsive display to produce a visual indication that the battery tester is connected in the wrong polarity. Alternatively, substantially identical temperature responsive displays may be placed in thermal contact with each of the zener diodes 20 and 58 to provide a battery tester which functions the same regardless of the polarity. It is also possible to substitute a single bipolar zener diode for the two zener diodes illustrated in FIG. 9.

In some instances it may be desirable to employ multiple zener diodes having different threshold voltages in the battery tester to facilitate detection of different voltage levels for a battery. A schematic illustration of a circuit 60 employing multiple zener diodes 62, 64 and 66 is shown in FIG. 10. The zener diodes 62, 64 and 66 are connected parallel to each other and each has a current limiting resistor 68, 70 and 72, respectively, in series with the zener diode. Separate temperature responsive displays thermally coupled with each zener diode 62, 64, 66 can then be used to produce a visual indication when the associated zener diode is supplied with a voltage exceeding its threshold voltage. A battery tester employing multiple diodes in an arrangement such as that shown in FIG. 10 can be used to provide separate readouts for discrete voltage levels of the battery which accurately indicate the charge level of the battery being tested.

A further embodiment of a battery tester in accordance with the present invention is illustrated in the schematic circuit diagram of FIG. 11. The circuit 76 illustrated in FIG. 11 is similar to that illustrated in FIG. 6 with the addition of a resistance heating element 78 electrically connected in parallel with the zener diode 20 and current limiting resistor 50. An additional temperature responsive display is preferably associated with the resistance heating element 78 and thermally coupled therewith to indicate that contact has been made between the battery and the battery tester. When the battery tester is electrically connected with the battery 24, electrical current will flow through the circuit 76 and through the resistance heating element 78 thus heating the temperature responsive display associated therewith. By employing appropriate thermochromic materials which have relatively low transition temperatures in the temperature responsive display, the display can be made to indicate visually that electrical connection has been made with the battery.

Another embodiment of a battery tester is illustrated in the schematic circuit diagram of FIG. 12. The circuit 80 of FIG. 12 includes a zener diode 20 and a tapered heating resistance element 82 in series with the zener diode and a battery 24. In this embodiment the temperature responsive display is located in thermally coupled relation with the tapered resistance heating element 82 rather than with the zener diode 20. The temperature responsive display and tapered resistance heating element may be similar to those packaged with Duracell ® batteries. When the battery 24 is depleted and is only capable of impressing across the circuit 80 a voltage which is less than the threshold conducting voltage of the zener diode 20, there will be substantially no current flow through the circuit 80 and the resistance heating element 82. Consequently, the temperature responsive display will not change from its state when the battery tester is not connected to a battery. When the battery 24 is charged sufficiently to impress upon the circuit 80 a voltage exceeding the threshold voltage of the zener diode 20, a current, which is a function of the voltage of the battery 24 exceeding the threshold conducting voltage of the diode and the internal resistance of the diode and the resistance of the tapered resistance heating element 82, will cause the resistance heating element to dissipate heat as a function of that current and the resistance of the resistance heating element. For voltages of the battery 24 exceeding the threshold voltage of the zener diode only slightly, a relatively small area of the tapered resistance heating element 82 having a small cross-sectional area will generate sufficient heat to cause the thermochromic materials in the temperature responsive display to transition to their transparent states. For greater voltages exceeding the threshold voltage of the zener diode 20, a larger portion of the tapered resistance heating element 82 including sections having relatively larger cross-sectional areas will generate sufficient heat to cause greater corresponding portions of the thermochromic materials in the temperature responsive display to transition to their transparent states. Consequently, by using a zener diode 20 in series with the tapered resistance heating element 82 and temperature responsive display, a battery tester can be made to provide a relatively accurate response over a small voltage range through the biasing action of the zener diode.

A further embodiment of a battery tester is illustrated in FIGS. 13 and 14. The battery tester 90 is constructed similar to the battery tester of FIG. 1 with a temperature responsive display 12 and a thin polyester film 14 as well as conductive leads and a zener diode (not shown). The battery tester 90 further includes a designation 92 in the form of a minus sign printed on the surface of the film 14 opposite from the conductive strips indicating where the battery tester is to be applied to the negative terminal of a battery. The conductive strips have a resistance per unit length which can be used to add resistance to or subtract resistance from the overall circuit based upon where along the length of the conductive strip that the terminal of the battery contacts the conductive strip. The battery tester 90 additionally includes an ambient temperature responsive indicator 94 to designate the area where the battery tester should be connected to the positive terminal of a battery. The ambient temperature responsive indicator 94 includes at least two discrete sections 96 and 98. Which portion of the indicator 96 or 98 which is in the form of a plus sign is determined by the ambient temperature. The indicator 98 is in the form of a plus sign printed directly upon the film 14. The indicator 98 is covered by a thermochromic material 100. A thermochromic material similar to the thermochromic material 100 used to cover the indicator 98 is used to form the indicator 96, also configured as a plus sign.

Since the temperature of the temperature responsive display 12 is dependent not only on the heat supplied by the zener diode 20 but also heat supplied by the ambient surroundings, under some conditions it may be necessary for the zener diode to generate more or less heat in order to achieve the desired response from the temperature responsive display 12. For example, at low ambient temperatures more heat is required from the zener diode 20 to elevate the temperature responsive display 12 above the transition temperatures of the thermochromic materials to achieve the desired response for a given battery voltage than is required at higher ambient temperatures. One method of compensating for this difference in ambient temperature is by choosing appropriate thermochromic materials for the ambient temperature responsive indicator 94 which have transition temperatures at the desired ambient temperature to designate different contact points for the positive terminal of the battery as a function of the ambient temperature and therefore to alter the overall resistance of the battery tester corresponding to the portion of the conductive strip participating in the battery tester circuit. For example, the thermochromic material 100 covering the indicator 98 and the thermochromic material used to form the indicator 96 may have a transition temperature of 20° C. Accordingly, as is shown in FIG. 13 when the ambient temperature is above 20° C., the indicator 96 will be in a transparent state and nearly invisible and the thermochromic material 100 covering the indicator 98 will also be transparent allowing the indicator 98 to be visible. (Dashed lines in FIGS. 13 and 14 show that an indicator 96 or 98 is transparent, while a visible indicator is shown by shading.) As the indicator 98 is located further away from the temperature responsive display 12 and the zener diode 20, a greater portion of the conductive strip will participate in the circuit and thus the resistance of the overall circuit formed by the battery and the battery tester will be relatively high thereby decreasing the current flow through the battery tester and the heat generated by the zener diode. Conversely, for temperatures below 20° C. the thermochromic material forming the indicator 96 will be below its transition temperature and the indicator 96 will be visible. Similarly, the thermochromic material 100 covering the indicator 98 will also be below its transition temperature and will be in an opaque state thus coveting the indicator 98 from view. Since the indicator 96 is closer to the temperature responsive display 12 and zener diode 20, there is less of the conductive strip participating in the circuit and thus less resistance in the circuit formed by the battery tester 98 and an attached battery. Therefore, more current will flow through the battery tester 90 and zener diode 20, and the zener diode will generate more heat thus compensating for the lower ambient temperature.

A further embodiment of a circuit for a battery tester including over-current protection is illustrated in FIG. 15. The circuit 102 includes in electrical series a battery 24, a zener diode 20 and an electrical element 104 which exhibits a large increase in resistance as the element is heated near a certain temperature. An example of such an element 104 is marketed by Raychem Corporation as "Polyswitch". The element 104 is thermally coupled to the zener diode 20. Consequently, if a battery tester employing the circuit 102 is connected to a battery in the wrong polarity, as the zener diode 20 generates heat as a function of the unbiased voltage across the diode, the dissipated heat will heat the element 104. As the temperature of the element 104 nears a certain point its resistance will increase greatly, for example from 0.1 ohms to 10 ohms, thus enabling the element to function as a current limiting resistor and preventing damage to the components of the circuit. It may also be desirable to thermally couple a temperature responsive display, such as those discussed above in conjunction with current limiting resistors, to the element 104 to provide a visual indication when the battery tester is connected in the wrong polarity.

In some instances it may be possible to incorporate the thermochromic material onto the package containing the zener diode, such as is shown in FIG. 16. FIG. 16 is an illustration of a typical surface mount package 106 for a zener diode including contacts 108. The temperature responsive display 110 can be printed directly upon the top surface 112 of the package 106. The package 106 can then be incorporated into a suitably constructed battery tester similar to those described above. Alternatively, an electrical component such as the zener diode package 106 with a temperature responsive display 110 disposed thereon can be used in a variety of other means to provide current sensing or voltage sensing in any circuit, including those other than in battery testers.

What is claimed is:

1. A device for measuring the voltage of a battery, comprising:
   a temperature responsive material;
   a conductive heating means for heating said temperature responsive material in response to an applied current; and
   diode means for applying a current from a battery to said conductive heating means when a battery having a voltage exceeding a threshold conducting voltage of said diode means is electrically connected to said device.

2. The device of claim 1, wherein said temperature responsive material includes at least one thermochromic material.

3. The device of claim 1, wherein said conductive heating means is tapered to generate differing quantities of heat along its length.

4. A device for measuring the voltage of a voltage source, comprising:
   a temperature responsive display; and
   electrical means thermally coupled with said temperature responsive display for heating said temperature responsive display when a voltage exceeding a threshold conducting voltage of said electrical means is impressed across said electrical means.

5. The device of claim 4, wherein said temperature responsive display includes at least one thermochromic material.

6. The device of claim 4, wherein said temperature responsive display includes two thermochromic materials having different opaque colors and different transition temperatures, the thermochromic material having the lower transition temperature being disposed atop the thermochromic material having a higher transition temperature.

7. The device of claim 4, wherein said temperature responsive display includes at least two thermochromic materials disposed adjacent one another, said at least two thermochromic materials having different transition temperatures.

8. The device of claim 4, wherein said temperature responsive display is disposed on one side of an electrically non-conductive film and said electrical means is disposed on an opposite side of said film.

9. The device of claim 8, further including conductive leads disposed on said film and electrically coupled to said electrical means.

10. The device of claim 4, further including a current limiting resistor in electrical series with said electrical means.

11. The device of claim 4, wherein said electrical means includes a diode.

12. The device of claim 11, wherein said temperature responsive display does not significantly respond to heat generated by said diode means when a voltage below said threshold conducting voltage is impressed across said diode means.

13. The device of claim 11, wherein said diode means includes a zener diode.

14. A device for testing a voltage source, comprising:
    a temperature responsive display; and
    electrical means thermally coupled with said temperature responsive material for heating said temperature responsive material when electrically coupled to a voltage source having a voltage exceeding a threshold conducting voltage of said electrical means.

15. The device of claim 14, said electrical means comprising a zener diode.

16. The device of claim 14, said electrical means comprising plural zener diodes.

17. The device of claim 14, said electrical means comprising plural zener diodes in electrical series and reverse polarity relation to each other.

18. A device for testing a voltage source, comprising:
    a temperature responsive material; and
    a plurality of diode means thermally coupled with said temperature responsive material, each of said plurality of diode means for heating a portion of said temperature responsive material when electrically coupled to a voltage source having a voltage exceeding a threshold conducting voltage for each of said plurality of diode means.

19. The device of claim 18, wherein said temperature responsive material is disposed is discrete regions, each region being thermally coupled to a separate diode means.

20. The device of claim 18, further including a current limiting resistor in electrical series with each of said diode means.

21. A method for measuring the voltage across a device, comprising the steps of:
    sensing the voltage of such device;
    generating heat to produce a visual indication by conducting current through a heat generating device when the detected voltage exceeds a threshold conducting voltage of said heat generating device.

22. A device for testing a voltage source, comprising:
    a temperature responsive material;
    diode means thermally coupled with said temperature responsive material for heating said temperature responsive material when electrically coupled to a battery having a voltage exceeding a threshold conducting voltage of said diode means; and,
    conductive heating means electrically in parallel with said diode means for heating said temperature responsive material in response to an applied current from such battery.

23. A circuit comprising:
    a thin dielectric film
    a heat generating electrical component surface mounted to said dielectric film; and,
    a temperature responsive material thermally coupled with said heat generating electrical component, wherein said heat generating electrical component is activated upon application of a voltage exceeding a threshold conducting voltage of said heat generating electrical component.

24. A device for testing a voltage source over differing ambient temperatures comprising:
a first temperature responsive display;
diode means thermally coupled to said first temperature responsive display and electrically coupled to plural conductive leads, said diode means for heating said first temperature responsive display when a voltage exceeding a threshold conducting voltage of said diode means is impressed across said diode means; and
a second temperature responsive display which is responsive over ambient temperature ranges, said second temperature responsive display providing different visual indicia for different ambient temperatures to assist the user in determining at what point along said conductive leads to couple said leads to the voltage source.

25. The device of claim 24, at least one of said conductive lead has a resistance characteristic.

26. The device of claim 25, said second temperature responsive display indicating the point along a respective conductive lead for connection to a voltage source to provide an appropriate resistance in circuit with said diode means to compensate for ambient temperature.

27. A device for measuring the voltage of a voltage source, comprising:
a first temperature responsive display; and
first and second diode means in electrical series, said first diode means thermally coupled with said temperature responsive display for heating said temperature responsive display when a voltage exceeding a threshold conducting voltage of said first diode means is impressed across said first and second diode means; said second diode means for protecting said first diode from damage when said impressed voltage is of wrong polarity.

28. The device of claim 27, including a second temperature responsive display thermally coupled to said second diode means.

29. The device of claim 28, wherein said second temperature responsive display displays a visual indicia indicating if the voltage impressed across said diode means is of wrong polarity.

30. The device of claim 27, wherein said first temperature responsive display includes at least one thermochromic material.

31. The device of claim 27, wherein said first temperature responsive display includes two thermochromic materials having different opaque colors and different transition temperatures, the thermochromic material having the lower transition temperature being disposed atop the thermochromic material having a higher transition temperature.

32. The device of claim 27, wherein said first temperature responsive display includes at least two thermochromic materials disposed adjacent one another, said at least two thermochromic materials having different transition temperatures.

33. The device of claim 27, wherein said first temperature responsive display is disposed on one side of an electrically non-conductive film and said first and second diode means are disposed on an opposite side of said film.

34. The device of claim 27, further including conductive leads disposed on said film and electrically coupled to said first and second diode means.

35. The device of claim 27, further including a current limiting resistor in electrical series with said first and second diode means.

36. The device of claim 27, wherein said temperature responsive display does not significantly respond to heat generated by said first diode means when a voltage below said threshold voltage is impressed across said first and second diode means.

* * * * *